(12) United States Patent
Boochakorn

(10) Patent No.: US 6,264,415 B1
(45) Date of Patent: Jul. 24, 2001

(54) MECHANISM FOR ACCURATELY TRANSFERRING A PREDETERMINED NUMBER OF INTEGRATED CIRCUIT PACKAGES FROM TUBE TO TUBE

(75) Inventor: Sa-Nguan Boochakorn, Bangkok (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/409,181

(22) Filed: Sep. 30, 1999

(51) Int. Cl.[7] .................................................. B65G 59/06
(52) U.S. Cl. ...................... 414/404; 414/798.9; 414/403; 414/810; 29/740; 198/459.2; 193/40; 324/158.1; 221/208
(58) Field of Search ...................................... 414/403, 404, 414/798.9, 414, 418, 810, 811, 416.09; 29/740; 198/525, 459.2; 193/38, 40; 221/224, 237, 208; 324/158.1

(56) References Cited

U.S. PATENT DOCUMENTS

| | | | |
|---|---|---|---|
| 2,570,265 | * 10/1951 | Nordquist et al. | 192/459.2 X |
| 3,399,793 | * 9/1968 | Walker | 414/414 |
| 4,222,166 | * 9/1980 | Kurek et al. | 414/404 X |
| 4,724,965 | * 2/1988 | Willberg | 414/404 X |
| 5,116,185 | * 5/1992 | Lofstedt | 414/404 X |
| 5,236,076 | * 8/1993 | Sung | 414/404 X |
| 5,772,387 | * 6/1998 | Nakumura et al. | 414/404 X |
| 6,132,167 | * 10/2000 | Ikeya et al. | 414/798.9 |
| 6,135,699 | * 10/2000 | Yutaka et al. | 414/414 X |

* cited by examiner

Primary Examiner—Frank E. Werner
(74) Attorney, Agent, or Firm—Monica H. Choi

(57) ABSTRACT

A mechanism for accurately transferring a predetermined number of IC (Integrated Circuit) packages from a first IC (integrated Circuit) storage tube to a second IC (Integrated Circuit) storage tube. A first tube platform holds the first IC package storage tube at an inclination, and a second tube platform holds the second IC package storage tube at an inclination. Additionally, an IC (Integrated Circuit) package transfer wheel is disposed between the first tube platform and the second tube platform. The IC package transfer wheel has a plurality of spokes radiating outward from a center of the IC package transfer wheel. An IC package from the first IC package storage tube encounters a stopping spoke of the plurality of spokes of the IC package transfer wheel when the first IC package storage tube is placed on the first tube platform, and the stopping spoke prevents the IC package from entering the second IC package storage tube. A turning of the IC package transfer wheel causes the stopping spoke to be lowered such that the IC package enters into the second IC package storage tube. A dial may be coupled to the IC package transfer wheel, and an operator turns the dial to turn the IC package transfer wheel to cause the stopping spoke to be lowered such that the IC package enters into the second IC package storage tube. A count index, coupled to the dial of the IC package transfer wheel, counts a number of IC packages transferred from the first IC package storage tube to the second IC package storage tube with turning of the dial.

22 Claims, 3 Drawing Sheets

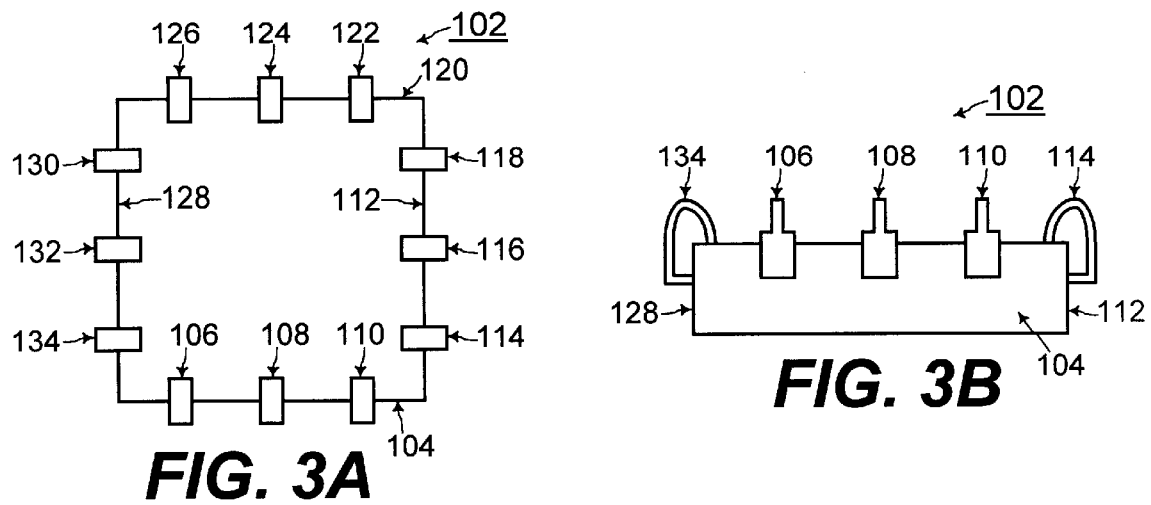
FIG. 3A
FIG. 3B
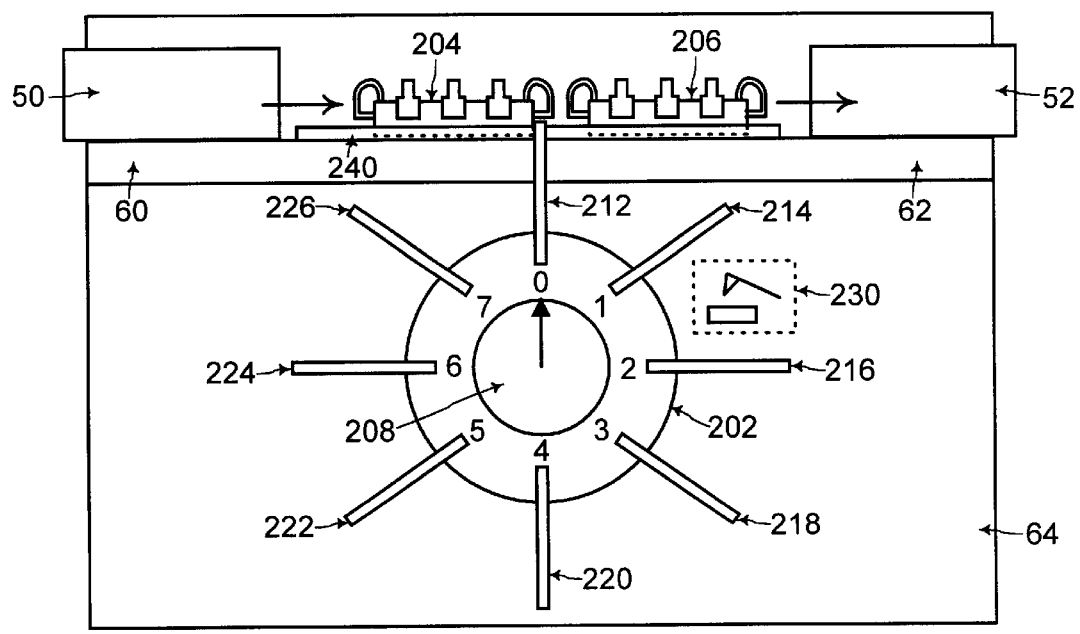
FIG. 4

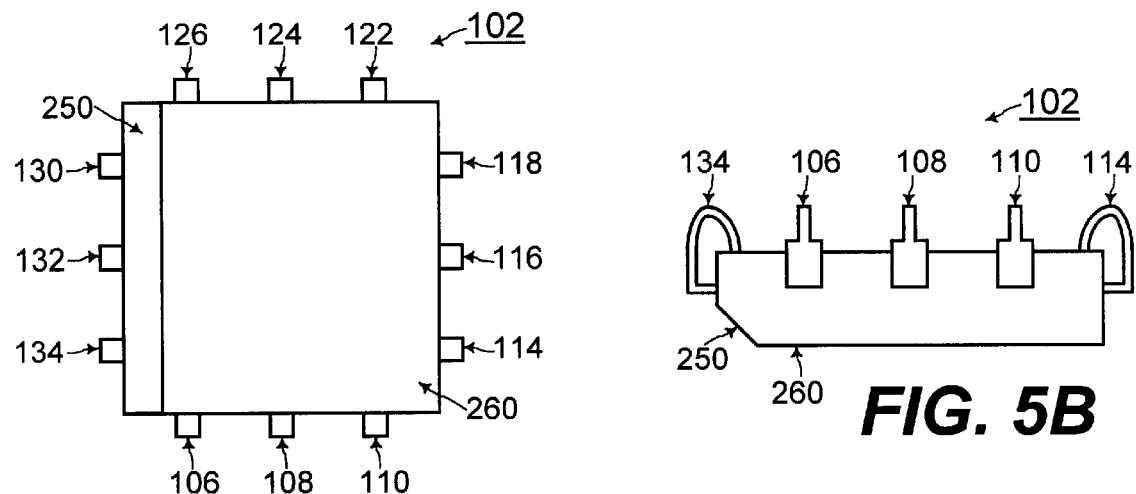
FIG. 5A
FIG. 5B
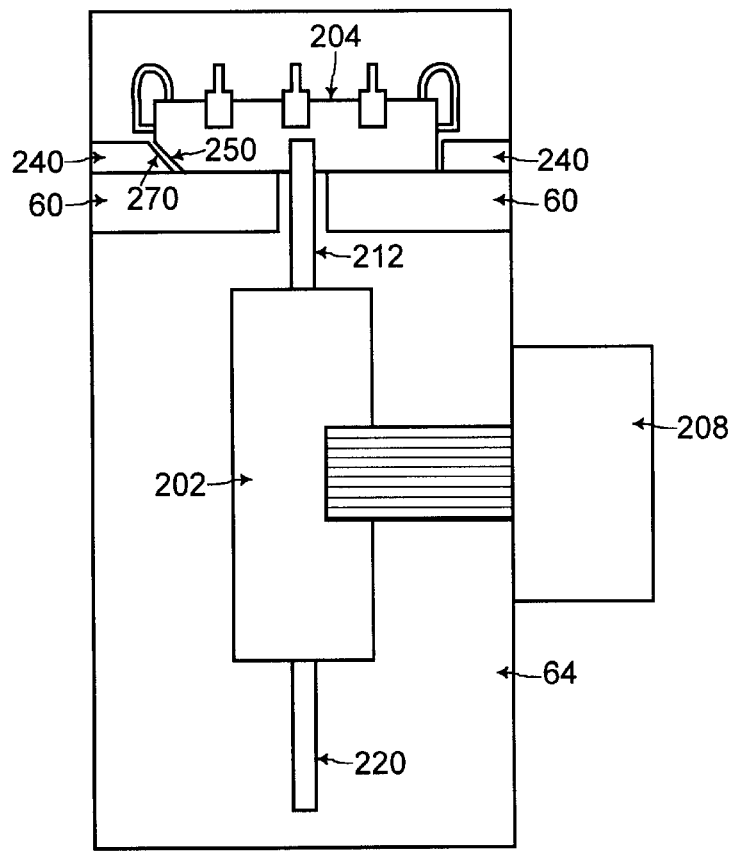
FIG. 6

MECHANISM FOR ACCURATELY TRANSFERRING A PREDETERMINED NUMBER OF INTEGRATED CIRCUIT PACKAGES FROM TUBE TO TUBE

TECHNICAL FIELD

The present invention relates generally to IC (Integrated Circuit) package handling systems, and more particularly, to a mechanism for accurately transferring a predetermined number of IC packages from a first IC package storage tube to a second IC package storage tube with minimized bent leads on the IC packages and with proper orientation of the IC packages.

BACKGROUND OF THE INVENTION

Referring to FIG. 1, a plurality of IC (Integrated Circuit) packages 12, 14, 16, 18, 20, and 22 are stored within a first IC (Integrated Circuit) package storage tube 50. During manufacture and shipping of IC packages, a predetermined number of IC packages may need to be transferred from the first IC package storage tube 50 to a second IC (Integrated Circuit) package storage tube 52. Referring to FIG. 1, in the prior art, an operator aligns the open end of the first IC package storage tube 50 to the open end of the second IC package storage tube 52. The first IC package storage tube 50 and the second IC package storage tube 52 are disposed at an inclination such that the plurality of IC packages from the first IC package storage tube 50 slides into the second IC package storage tube 52.

However, such manual transfer of IC packages from the first IC package storage tube 50 into the second IC package storage tube 52 may result in bent leads on the IC packages when the first IC package storage tube 50 is not aligned properly with the second IC package storage tube 52. In addition, with such manual transfer of IC packages, the IC packages may not be transferred from the first IC package storage tube 50 into the second IC package storage tube 52 with proper orientation as desired by the customers of the IC packages. Furthermore, during such manual transfer of IC packages, the operator keeps count of the number of IC packages transferred from the first IC package storage tube 50 into the second IC package storage tube 52. Such counting by the operator may be inaccurate resulting in either an insufficient or an excess number of IC packages being shipped to the customer.

Thus, a mechanism is desired for accurately transferring a predetermined number of IC packages from the first IC package storage tube 50 into the second IC package storage tube 52 with minimized bent leads on the IC packages and with proper orientation of the IC packages.

SUMMARY OF THE INVENTION

Accordingly, a general aspect of the present invention includes an apparatus and method for accurately transferring a predetermined number of IC (Integrated Circuit) packages from a first IC (Integrated Circuit) storage tube to a second IC (Integrated Circuit) storage tube.

In one embodiment of the present invention, a first tube platform holds the first IC package storage tube at an inclination, and a second tube platform holds the second IC package storage tube at an inclination. Additionally, an IC (Integrated Circuit) package transfer wheel is disposed between the first tube platform and the second tube platform. The IC package transfer wheel has a plurality of spokes radiating outward from a center of the IC package transfer wheel. An IC package from the first IC package storage tube encounters a stopping spoke of the plurality of spokes of the IC package transfer wheel when the first IC package storage tube is placed on the first tube platform, and the stopping spoke prevents the IC package from entering the second IC package storage tube. A turning of the IC package transfer wheel causes the stopping spoke to be lowered such that the IC package enters into the second IC package storage tube. The turning of the IC package transfer wheel may also cause a pushing spoke of the plurality of spokes of the IC package transfer wheel to push the IC package into the second IC package storage tube.

In another aspect of the present invention, a dial is coupled to the IC package transfer wheel, and an operator turns the dial to turn the IC package transfer wheel to cause the stopping spoke to be lowered such that the IC package enters into the second IC package storage tube. A count index, coupled to the dial of the IC package transfer wheel, counts a number of IC packages transferred from the first IC package storage tube to the second IC package storage tube with turning of the dial.

According to another aspect of the present invention, the IC package includes an orientation surface, and the present invention includes a chamber disposed on the first tube platform and the second tube platform. The IC package travels through the chamber when being transferred from the first IC package storage tube to the second IC package storage tube, and the chamber includes an orientation wall that the orientation surface of the IC package is aligned with when the IC package is transferred from the first IC package storage tube to the second IC package storage tube with proper orientation.

In this manner, the IC package transfer wheel ensures accurate transfer of each of the IC packages from the first IC package storage tube into the second IC package storage tube with proper alignment of the first IC package storage tube and the second IC package storage tube such that bent leads on the IC packages are minimized. In addition, a count index may be used with the dial for turning the IC package transfer wheel to accurately keep track of the number of IC packages transferred from the first IC package storage tube into the second IC package storage tube. Furthermore, the present invention monitors that the IC package is transferred from the first IC package storage tube into the second IC package storage tube with proper orientation.

These and other features and advantages of the present invention will be better understood by considering the following detailed description of the invention which is presented with the attached drawings.

BRIEF DESCRIPTION OF THE DRAWINGS

FIG. 3A shows a plurality of leads at the bottom of an example IC package, and FIG. 3B shows a side view of the IC package of FIG. 3A;

FIG. 4 shows a front view of the inside components of the IC package transfer mechanism of FIG. 2 including an IC package transfer wheel, a dial, and a count index for accurately transferring a predetermined number of IC packages, according to an embodiment of the present invention;

FIG. 5A shows a top view of the example IC package of FIG. 3A including an orientation surface on the IC package such that a chamber within the IC package transfer mechanism of FIG. 2 ensures that the IC package is transferred with proper orientation, and FIG. 5B shows a side view of the IC package of FIG. 5A; and FIG. 6 shows a side view of the inside components of the IC package transfer mechanism of FIGS. 2 and 4 including the chamber for ensuring that the IC package is transferred from the first IC package storage tube to the second IC package storage tube with proper orientation, according to an embodiment of the present invention;

The figures referred to herein are drawn for clarity of illustration and are not necessarily drawn to scale. Elements having the same reference number in FIGS. 1, 2, 3A, 3B, 4, 5A, 5B, and 6 refer to elements having similar structure and function.

DETAILED DESCRIPTION

Figure 2:
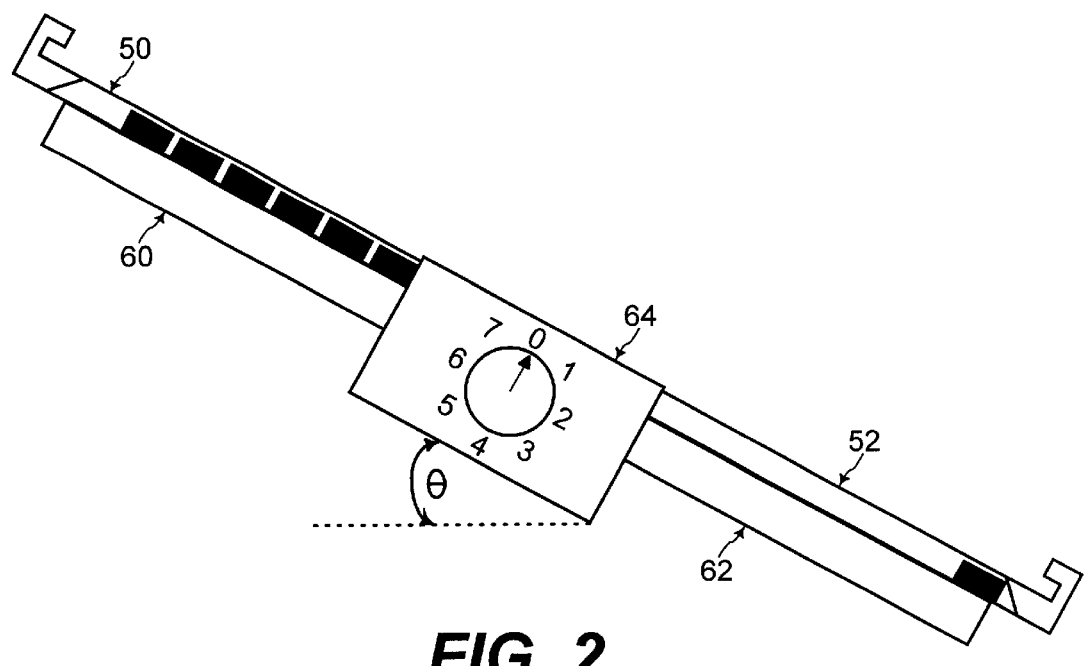
FIG. 2 shows use of an IC package transfer mechanism disposed between the first IC package storage tube and the second IC package storage tube for accurate transfer of a predetermined number of IC packages, according to an embodiment of the present invention.

Referring to FIG. 2, according to an embodiment of the present invention, a first tube platform 60 is disposed at an angle with respect to the horizontal surface and holds the first IC package storage tube 50. A second tube platform 62 is also disposed at an angle with respect to the horizontal surface and holds the second IC package storage tube 52. An IC (Integrated Circuit) package transfer mechanism 64 is disposed between the first tube platform 60 and the second tube platform 62. The IC package transfer mechanism 64 operates to accurately transfer a predetermined number of IC packages from the first IC package storage tube 50 to the second IC package storage tube 52. In one embodiment of the present invention, the first tube platform 60, the second tube platform 62, and the IC package transfer mechanism 64 are disposed at an angle of $\theta=45°$ with respect to the horizontal surface as shown in FIG. 2.

Figure 1:
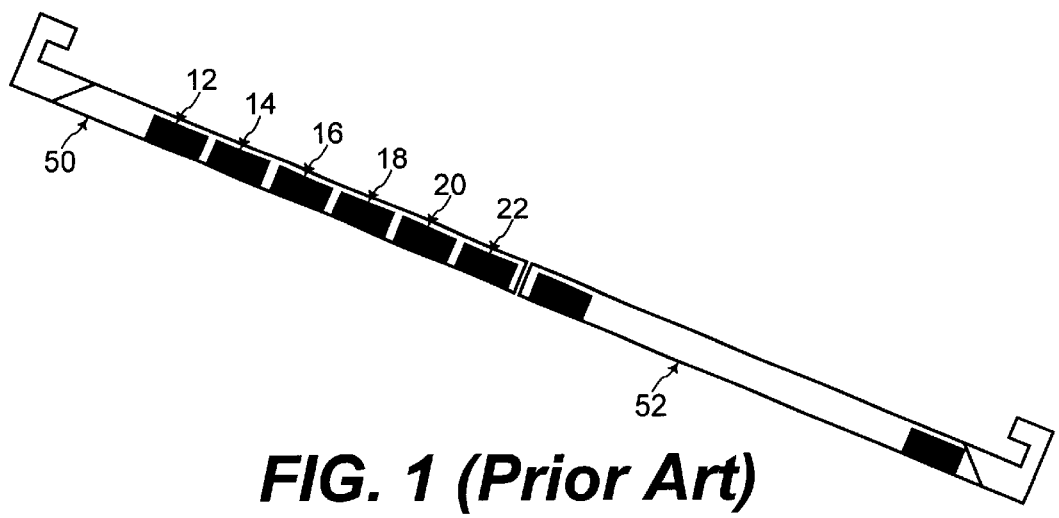
FIG. 1 illustrates manual transfer of IC packages from a first IC package storage tube into a second IC package storage tube, according to the prior art.

Referring to FIG. 3A, a typical IC package 102 includes a plurality of leads for coupling nodes of an IC die within the IC package 102 to a system external to the IC package 102. FIG. 3A shows a bottom view of the IC package 102. A first side 104 of the IC package 102 includes a first lead 106, a second lead 108, and a third lead 110. A second side 112 of the IC package 102 includes a fourth lead 114, a fifth lead 116, and a sixth lead 118. A third side 120 of the IC package 102 includes a seventh lead 122, an eighth lead 124, and a ninth lead 126. A fourth side 128 of the IC package 102 includes a tenth lead 130, an eleventh lead 132, and a twelfth lead 134. A typical IC package includes more numerous leads to a side of the IC package. However, three leads to a side of the IC package 102 are shown in FIG. 1A for clarity of illustration.

Referring to FIG. 3B, a side view of the first side 104 of the IC package 102 of FIG. 1A is shown. The side view of the first side 104 of the IC package 102 in FIG. 3B also shows a side view of the fourth lead 114 on the second side 112 of the IC package 102 and a side view of the twelfth lead 134 on the fourth side 128 of the IC package 102.

Referring to FIGS. 2 and 3B, during manufacture and shipping of IC packages, such an IC package 102 may need to be transferred from the first IC package storage tube 50 into the second IC package storage tube 52. The first IC package storage tube 50 is placed onto the first tube platform 60, and the second IC package storage tube 52 is placed onto the second tube platform 62.

Referring to FIGS. 2 and 4, a front view of the inside components of the IC package transfer mechanism 64 includes an IC (Integrated Circuit) package transfer wheel 202. The IC package transfer wheel 202 has a plurality of spokes including a first spoke 212, a second spoke 214, a third spoke 216, a fourth spoke 218, a fifth spoke 220, a sixth spoke 222, a seventh spoke 224, and an eighth spoke 226. These plurality of spokes radiate outward from a center of the IC package transfer wheel 202 as illustrated in FIG. 4.

Referring to FIGS. 2 and 4, because the first IC package storage tube 50 (and the first tube platform 60) are disposed at an inclination, an IC package 204 slides out of the first IC package storage tube 50. (Note that although the first IC package storage tube 50, the first tube platform 60, the second IC package storage tube 52, the second tube platform 62, and the IC package transfer mechanism 64 are disposed at an inclination during operation as illustrated in FIG. 2, such components are illustrated as being horizontal in FIG. 4 for clarity of illustration.) As the IC package 204 slides out of the first IC package storage tube 50, the IC package 204 encounters a stopping spoke (i.e. the first spoke 212 in FIG. 4) of the plurality of spokes of the IC transfer wheel 202 as illustrated in FIG. 4. This stopping spoke 212 prevents the IC package 204 from entering into the second IC package storage tube 52.

For transferring the IC package 204 into the second IC package storage tube 52, the IC transfer wheel 202 is turned clock-wise such that the stopping spoke 212 is lowered. With lowering of the stopping spoke 212, the IC package 204 slides into the second IC package storage tube 52 since the first IC package storage tube 50, the first tube platform 60, the second IC package storage tube 52, the second tube platform 62, and the IC package transfer mechanism 64 are disposed at an inclination as illustrated in FIG. 2.

Referring to FIG. 4, for example, the second spoke 214 of the IC transfer wheel 202 acted as a stopping spoke for another IC package 206 before the IC package transfer wheel 202 was turned clock-wise. With such turning of the IC package transfer wheel 202, the second spoke 214 is turned toward the right and lowered such that the IC package 206 slides into the second IC package storage tube 52 since the first IC package storage tube 50, the first tube platform 60, the second IC package storage tube 52, the second tube platform 62, and the IC package transfer mechanism 64 are disposed at an inclination as illustrated in FIG. 2. In addition, with such turning of the IC package transfer wheel, the first spoke 212 may also act as a pushing spoke that pushes the IC package 206 into the second IC package storage tube 52.

In this manner, transfer of each of an IC package from the first IC package storage tube 50 into the second IC package storage tube 52 is controlled by turning of the spokes of the IC package transfer wheel 202. The spokes of the IC package transfer wheel 202 may be automatically turned with electronic control of the movement of the IC package transfer wheel 202, as known to one of ordinary skill in the art of electronic automation. In that case, the IC package transfer wheel 202 would automatically be turned a predetermined angle for transfer of one IC package from the first IC package storage tube 50 into the second IC package storage tube 52. A counter may be incremented automatically with transfer of each IC package for keeping track of the number of IC packages transferred from the first IC package storage tube 50 into the second IC package storage tube 52.

Alternatively, the present invention may include a dial 208 coupled to the IC package transfer wheel 202 for manual turning of the IC package transfer wheel 202. In that case, an operator manually turns the dial 208 a predetermined angle for transfer of one IC package from the first IC package storage tube 50 into the second IC package storage tube 52. The dial 208 may includes a count index printed around the dial 208 that indicates the predetermined angle that the dial 208 should be turned to effectively transfer an IC package from the first IC package storage tube 50 into the second IC package storage tube 52 as illustrated in FIG. 4.

In that case, for effective transfer of an IC package, the dial 208 is turned clockwise from a prior count index number to a subsequent count index number. In addition, the count index is associated with each of the plurality of spokes of the IC transfer wheel 202 and indicates the number of IC packages transferred from the first IC package storage tube 50 into the second IC package storage tube 52 as the dial 208 is turned clock-wise through the count index numbers.

According to another aspect of the present invention, referring to FIG. 4, a clicker 230 is disposed below a spoke of the IC package transfer wheel 202 to generate a clicking sound when the IC package transfer wheel 202 is turned to transfer an IC package from the first IC package storage tube 50 into the second IC package storage tube 52. With such turning of the IC package transfer wheel 202 for effective transfer of an IC package, a spoke of the IC package transfer wheel hits the clicker 230 to generate the clicking sound. Such a clicking sound indicates to an operator that an IC package has been effectively transferred from the first IC package storage tube 50 into the second IC package storage tube 52.

Referring to FIG. 4, according to another embodiment of the present invention, an IC package travels through a chamber 240 disposed on the first tube platform 60 and the second tube platform 62 when being transferred from the first IC package storage tube 50 into the second IC package storage tube 52 with proper orientation. FIG. 5A shows a top view of the IC package 102 of FIG. 3A, and FIG. 5B shows the side view of the IC package of FIG. 5A. The IC package 102 includes an orientation surface 250 that is angled from a top surface 260 of the IC package 102 as illustrated in FIGS. 5A and 5B.

Referring to FIGS. 4 and 6, a side view of the inner components of the IC package transfer mechanism 64 shows the chamber 240 disposed on the first tube platform 60. Elements having the same reference number in FIGS. 4, 5, and 6 refer to elements having similar structure and function. Referring to FIG. 6, the chamber 240 includes an orientation wall 270 that the orientation surface 250 of the IC package 204 is aligned with when the IC package 204 is transferred from the first IC package storage tube 50 to the second IC package storage tube 52 with proper orientation. The chamber 240 monitors that an IC package is transferred with proper orientation because an IC package does not fit through the chamber 240 if the orientation surface 250 of the IC package is not properly aligned with the orientation wall 270 of the chamber 240.

In this manner, the turning of the spokes of the IC package transfer wheel 202 with a predetermined angle ensures proper transfer of an IC package from the first IC package storage tube 50 to the second IC package storage tube 52. In addition, by use of a count index, a predetermined number of IC packages may be accurately transferred from the first IC package storage tube 50 to the second IC package storage tube 52. Furthermore, by use of the chamber 240 that has a shape corresponding to the shape of the IC packages, the present invention monitors that the IC packages are transferred from the first IC package storage tube into the second IC package storage tube with proper orientation.

The foregoing is by way of example only and is not intended to be limiting. For instance, the IC package 102 is by way of example only. A typical IC package 102 may have more numerous leads. Furthermore, an IC package storage tube may hold more numerous IC packages than illustrated in FIGS. 1 and 2. In addition, the number of spokes of the IC package transfer wheel 202 is by way of example only, and the present invention may be advantageously practiced with more numerous spokes and a correspondingly higher count index, as would be apparent to one of ordinary skill in the art from the description herein.

The present invention is limited only as defined in the following claims and equivalents thereof.

I claim:

1. An apparatus for accurately transferring a predetermined number of IC (Integrated Circuit) packages from a first IC (Integrated Circuit) package storage tube to a second IC (Integrated Circuit) package storage tube, the apparatus comprising:

a first tube platform having a support structure that holds said first tube platform at an inclination with respect to a horizontal axis such that said first tube platform supports said first IC package storage tube at said inclination when said first IC package storage tube is placed on said first tube platform;

wherein said first IC package storage tube has walls for holding a plurality of IC packages contained within said first IC package storage tube;

a second tube platform having a support structure that holds said second tube platform at an inclination with respect to said horizontal axis such that said second tube platform supports said second IC package storage tube at said inclination when said second IC package storage tube is placed on said second tube platform;

wherein said second IC package storage tube has walls for holding a plurality of IC packages to be contained within said second IC package storage tube; and an IC (Integrated Circuit) package transfer wheel having a support structure such that said IC package transfer wheel is disposed between said first tube platform and said second tube platform, said IC package transfer wheel having a plurality of spokes radiating outward from a center of said IC package transfer wheel;

and wherein an IC package from said first IC package storage tube encounters a stopping spoke of said plurality of spokes of said IC package transfer wheel when said first IC package storage tube is placed on said first tube platform, and wherein said stopping spoke prevents said IC package from entering said second IC package storage tube;

and wherein turning of said IC package transfer wheel causes said stopping spoke to be lowered such that said IC package enters into said second IC package storage tube;

and wherein said IC package transfer wheel includes motive means for turning said IC package transfer wheel by a predetermined angle to transfer one IC package from said first IC package storage tube into said second IC package storage tube;

and wherein said motive means turns said IC package transfer wheel at said predetermined angle for each of said predetermined number of IC packages until said predetermined number of IC packages are transferred from said first IC package storage tube into said second IC package storage tube.

2. The apparatus of claim 1, wherein said turning of said IC package transfer wheel causes a pushing spoke of said plurality of spokes of said IC package transfer wheel to push said IC package into said second IC package storage tube.

3. The apparatus of claim 1, further comprising:
a dial coupled to said IC package transfer wheel, wherein an operator turns said dial to turn said IC package transfer wheel to cause said stopping spoke to be lowered such that said IC package enters into said second IC package storage tube.

4. The apparatus of claim 3, further comprising:
a count index, coupled to said dial of said IC package transfer wheel, for counting a number of IC packages transferred from said first IC package storage tube to said second IC package storage tube with turning of said dial.

5. The apparatus of claim 3, further comprising:
a clicker, coupled to said dial of said IC package transfer wheel, for generating a clicking sound when said IC package is transferred from said first IC package storage tube to said second IC package storage tube with turning of said dial.

6. The apparatus of claim 1, wherein said IC package includes an orientation surface, and wherein said apparatus further includes:
a chamber disposed on said first tube platform and said second tube platform, wherein said IC package travels through said chamber when being transferred from said first IC package storage tube to said second IC package storage tube, and wherein said chamber includes an orientation wall that said orientation surface of said IC package is aligned with when said IC package is transferred from said first IC package storage tube to said second IC package storage tube with proper orientation.

7. The apparatus of claim 6, wherein said IC package does not fit through said chamber when said IC package is not transferred from said first IC package storage tube to said second IC package storage tube with proper orientation.

8. The apparatus of claim 1, wherein said inclination of said first tube platform is approximately 45° with respect to a horizontal surface.

9. The apparatus of claim 1, wherein said inclination of said second tube platform is approximately 45° with respect to a horizontal surface.

10. An apparatus for accurately transferring a predetermined number of IC (Integrated Circuit) packages from a first IC (Integrated Circuit) package storage tube to a second IC (Integrated Circuit) package storage tube, the apparatus comprising:
a first tube platform having a support structure that holds said first tube platform at an inclination with respect to a horizontal axis such that said first tube platform supports said first IC package storage tube at said inclination when said first IC package storage tube is placed on said first tube platform, wherein said inclination of said first tube platform is approximately 45° with respect to said horizontal axis;
wherein said first IC package storage tube has walls for holding a plurality of IC packages contained within said first IC package storage tube;
a second tube platform having a support structure that holds said second tube platform at an inclination with respect to said horizontal axis such that said second tube platform supports said second IC package storage tube at said inclination when said second IC package storage tube is placed on said second tube platforms, wherein said inclination of said second tube platform is approximately 45° with respect to said horizontal axis;
wherein said second IC package storage tube has walls for holding a plurality of IC packages to be contained within said second IC package storage tube;
an IC (Integrated Circuit) package transfer wheel having a support structure such that said IC package transfer wheel is disposed between said first tube platform and said second tube platform, said IC package transfer wheel having a plurality of spokes radiating outward from a center of said IC package transfer wheel;
and wherein an IC package from said first IC package storage tube encounters a stopping spoke of said plurality of spokes of said IC package transfer wheel when said first IC package storage tube is placed on said first tube platform, and wherein said stopping spoke prevents said IC package from entering said second IC package storage tube;
and wherein turning of said IC package transfer wheel causes said stopping spoke to be lowered and causes a pushing spoke of said plurality of spokes of said IC package transfer wheel to push said IC package into said second IC package storage tube;
a dial coupled to said IC package transfer wheel, wherein an operator turns said dial to turn said IC package transfer wheel to cause said stopping spoke to be lowered and to cause said pushing spoke to push said IC package into said second IC package storage tube;
and wherein said operator turns said dial a predetermined angle to turn said IC package transfer wheel by said predetermined angle to transfer one IC package from said first IC package storage tube into said second IC package storage tube;
and wherein said operator turns said dial to turn said IC package transfer wheel by said predetermined angle for each of said predetermined number of IC packages until said predetermined number of IC packages are transferred from said first IC package storage tube into said second IC package storage tube;
a count index, coupled to said dial of said IC package transfer wheel, for counting a number of IC packages transferred from said first IC package storage tube to said second IC package storage tube with turning of said dial;
a clicker, coupled to said dial of said IC package transfer wheel, for generating a clicking sound when said IC package is transferred from said first IC package storage tube to said second IC package storage tube with turning of said dial; and
a chamber disposed on said first tube platform and said second tube platform, wherein said IC package travels through said chamber when being transferred from said first IC package storage tube to said second IC package storage tube, and wherein said chamber includes an orientation wall that an orientation surface of said IC package is aligned with when said IC package is transferred from said first IC package storage tube to said second IC package storage tube with proper orientation;
and wherein said IC package does not fit through said chamber when said IC package is not transferred from said first IC package storage tube to said second IC package storage tube with proper orientation.

11. An apparatus for accurately transferring a predetermined number of IC (Integrated Circuit) packages from a first IC (Integrated Circuit) package storage tube to a second IC (Integrated Circuit) package storage tube, the apparatus comprising:

a first tube platform having a support structure that holds said first tube platform at an inclination with respect to a horizontal axis such that said first tube platform supports said first IC package storage tube at said inclination when said first IC package storage tube is placed on said first tube platform;

wherein said first IC package storage tube has walls for holding a plurality of IC packages contained within said first IC package storage tube;

a second tube platform having a support structure that holds said second tube platform at an inclination with respect to said horizontal axis such that said second tube platform supports said second IC package storage tube at said inclination when said second IC package storage tube is placed on said second tube platform;

wherein said second IC package storage tube has walls for holding a plurality of IC packages to be contained within said second IC package storage tube; and means for controlling transfer of an IC package from said first IC package storage tube to said second IC package storage tube using an IC package transfer wheel disposed between said first tube platform and said second tube platform;

wherein said IC package transfer wheel includes motive means for turning said IC package transfer wheel by a pretermined angle to transfer one IC package from said first IC package storage tube into said second IC package storage tube;

and wherein said motive means turns said IC package transfer wheel said predetermined angle for each of said preturmined number of IC packages until said predetermined number of IC packages are transferred from said first IC package storage tube into said second IC package storage tube.

12. The apparatus of claim 11, further comprising:

a dial coupled to said IC package transfer wheel, wherein an operator turns said dial to transfer said IC package from said first IC package storage tube to said second IC package storage tube.

13. The apparatus of claim 12, further comprising:

means for counting a number of IC packages transferred from said first IC package storage tube to said second IC package storage tube with turning of said dial.

14. The apparatus of claim 11, further comprising:

means for monitoring that said IC package is transferred from said first IC package storage tube to said second IC package storage tube with proper orientation.

15. A method for accurately transferring a predetermined number of IC (Integrated Circuit) packages from a first IC (Integrated Circuit) package storage tube to a second IC (Integrated Circuit) package storage tube, the method including the steps of:

placing said first IC package storage tube at a first tube platform, said first tube platform having a support structure that holds said first tube platform at an inclination with respect to a horizontal axis such that said first tube platform supports said first IC package storage tube at said inclination when said first IC package storage tube is placed on said first tube platform;

wherein said first IC package storage tube has walls for holding a plurality of IC packages contained within said first IC package storage tube;

placing said second IC package storage tube at a second tube platform, said second tube platform having a support structure that holds said second tube platform at an inclination with respect to said horizontal axis such that said second tube platform supports said second IC package storage tube at said inclination when said second IC package storage tube is placed on said second tube platform;

wherein said second IC package storage tube has walls for holding a plurality of IC packages to be contained within said second IC package storage tube;

and wherein an IC package from said first IC package storage tube encounters a stopping spoke of a plurality of spokes of an IC (Integrated Circuit) package transfer wheel when said first IC package storage tube is placed on said first tube platform, said IC package transfer wheel wheel having a support structure such that said IC package transfer wheel is disposed between said first tube platform and said second tube platform and having said plurality of spokes radiating outward from a center of said IC package transfer wheel;

and wherein said stopping spoke prevents said IC package from entering said second IC package storage tube; and turning said IC package transfer wheel to cause said stopping spoke to be lowered such that said IC package enters into said second IC package storage tube;

wherein said IC package transfer wheel includes motive means for turning said IC package transfer wheel by a predetermined angle to transfer one IC package from said first IC package storage tube into said second IC package storage tube;

and wherein said motive means turns said IC package transfer wheel said predetermined angle for each of said preturmined number of IC packages until said predetermined number of IC packages are transferred from said first IC package storage tube into said second IC package storage tube.

16. The method of claim 15, wherein said step of turning said IC package transfer wheel causes a pushing spoke of said plurality of spokes of said IC package transfer wheel to push said IC package into said second IC package storage tube.

17. The method of claim 15, wherein an operator turns a dial coupled to said IC package transfer wheel to turn said IC package transfer wheel to cause said stopping spoke to be lowered such that said IC package enters into said second IC package storage tube.

18. The method of claim 17, further including the step of:

counting a number of IC packages transferred from said first IC package storage tube to said second IC package storage tube with turning of said dial using a count index coupled to said dial of said IC package transfer wheel.

19. The method of claim 17, further including the step of:

generating a clicking sound when the IC package is transferred from said first IC package storage tube to said second IC package storage tube with turning of said dial.

20. The method of claim 15, further including the step of:

monitoring that said IC package is transferred from said first IC package storage tube to said second IC package storage tube with proper orientation.

21. The method of claim 15, wherein said inclination of said first tube platform is approximately 45° with respect to a horizontal surface.

22. The method of claim 15, wherein said inclination of said second tube platform is approximately 45° with respect to a horizontal surface.

* * * * *